(12) United States Patent
Otterson et al.

(10) Patent No.: US 8,840,271 B2
(45) Date of Patent: Sep. 23, 2014

(54) IN-PLANE BENT PRINTED CIRCUIT BOARDS

(75) Inventors: Marvin L. Otterson, Oxford, GA (US); Forrest Starnes McCanless, Oxford, GA (US)

(73) Assignee: ABL IP Holding LLC, Conyers, GA (US)

( * ) Notice: Subject to any disclaimer, the term of this patent is extended or adjusted under 35 U.S.C. 154(b) by 203 days.

(21) Appl. No.: 13/556,533

(22) Filed: Jul. 24, 2012

(65) Prior Publication Data

US 2014/0029261 A1   Jan. 30, 2014

(51) Int. Cl.
- *F21V 21/00* (2006.01)
- *H05K 3/22* (2006.01)
- *H05K 7/18* (2006.01)
- *H05K 1/02* (2006.01)

(52) U.S. Cl.
CPC .................................. *H05K 1/0278* (2013.01)
USPC ................. 362/249.06; 362/249.02

(58) Field of Classification Search
CPC ............... F21V 21/00; H05K 1/0278; H05K 2201/09063; H05K 2201/10106; H05K 2203/302
USPC .......................... 362/249.02, 249.06
See application file for complete search history.

(56) References Cited

U.S. PATENT DOCUMENTS

| | | |
|---|---|---|
| 5,495,076 A | 2/1996 | Davis |
| 5,519,596 A | 5/1996 | Woolverton |
| 6,070,986 A | 6/2000 | Yoneda |
| 6,326,553 B1 | 12/2001 | Yim et al. |
| 6,874,911 B2 | 4/2005 | Yoneda |
| 6,922,002 B2 | 7/2005 | Godo et al. |
| 7,152,996 B2 * | 12/2006 | Luk .............................. 362/240 |
| 7,380,961 B2 | 6/2008 | Moriyama et al. |
| 7,529,100 B2 | 5/2009 | Chuang et al. |
| 7,616,317 B2 | 11/2009 | Misener et al. |
| 7,926,193 B2 | 4/2011 | Peczalski |
| 2003/0112627 A1 | 6/2003 | Deese |
| 2004/0037078 A1 | 2/2004 | Lee |
| 2007/0195532 A1 * | 8/2007 | Reisenauer et al. .......... 362/294 |
| 2007/0291473 A1 | 12/2007 | Traynor |
| 2009/0236126 A1 | 9/2009 | Miyahara |
| 2010/0165657 A1 | 7/2010 | Lee et al. |
| 2010/0220046 A1 | 9/2010 | Plotz et al. |
| 2010/0244648 A1 | 9/2010 | Yoo |
| 2010/0277666 A1 | 11/2010 | Bertram et al. |
| 2010/0277907 A1 | 11/2010 | Phipps et al. |
| 2012/0155088 A1 | 6/2012 | Spaccasassi et al. |

FOREIGN PATENT DOCUMENTS

JP            06273652         9/1994

\* cited by examiner

*Primary Examiner* — Stephen F Husar
*Assistant Examiner* — James Cranson, Jr.
(74) *Attorney, Agent, or Firm* — Kilpatrick Townsend & Stockton, LLP

(57) ABSTRACT

In certain embodiments there is provided a blank for a printed circuit board and methods pertaining to same. In some embodiments, the blank is provided in a generally straight configuration and is capable of being deformed in-plane into a bent configuration, such as, but not limited to, a generally ring-shaped configuration, a generally square shape, or a generally S-shape. In some embodiments, the PCB is used with a lighting fixture and is populated with light emitting diodes.

20 Claims, 5 Drawing Sheets

IN-PLANE BENT PRINTED CIRCUIT BOARDS

FIELD OF THE INVENTION

The invention generally relates to bent printed circuit boards and methods pertaining to same.

BACKGROUND OF THE INVENTION

Light emitting diodes ("LEDs") are sometimes used in lighting fixtures as an alternative to more traditional light sources. When used in such fixtures, the LEDs are typically mounted on, and electrically connected to, a printed circuit board ("PCB"). Metal-core PCBs ("MCPCB") (also known as integrated metal substrates ("IMS")) are sometimes used in such applications. A MCPCB includes a metal (e.g., aluminum) base (as opposed to the traditional fiberglass base) onto which a dielectric layer is applied. A layer of copper is positioned on top of the dielectric layer. The LEDS are positioned on the copper layer, which acts as a circuit layer for electrical connections.

Metal core blanks (i.e., onto which the traces are created during fabrication and onto which the components are placed during assembly) are available in only a few predetermined sizes, such as 18 inches by 24 inches. These available sizes oftentimes are not compatible with the dimensions or design of the lighting fixtures in which the MCPCBs will be used. Rather, incorporation of a board in a fixture often requires that the dimensions of the board be tailored to accommodate the dimensions of the lighting fixture. Most commonly, this requires that portions of the board be trimmed away, resulting in waste of the board material.

By way only of example, MCPCBs may be used in recessed dome-shaped fixtures. The fixtures generally require use of a ring-shaped PCB with the LEDs arranged in a circle along the board. To create such a board, the excess material is removed during fabrication to create a circular PCB. The LEDs are mounted on the board in a circle. In some cases, over half of the surface area of the pre-formed metal-core board is discarded, and thus wasted, as a result of this process.

SUMMARY OF THE INVENTION

In certain embodiments there is provided a PCB that is capable of being bent in-plane into a desired shape and retaining itself in the shape. In some embodiments, the blank is a long relatively narrow strip formed of repeating units connected by bridges that is configured to be deformed into a generally ring-shaped configuration or other desired configuration.

The terms "invention," "the invention," "this invention" and "the present invention" used in this patent are intended to refer broadly to all of the subject matter of this patent and the patent claims below. Statements containing these terms should not be understood to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this patent, all drawings and each claim.

BRIEF DESCRIPTION OF THE FIGURES

Illustrative embodiments of the present invention are described in detail below with reference to the following drawing figures.

DETAILED DESCRIPTION OF THE INVENTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

Figure 1:
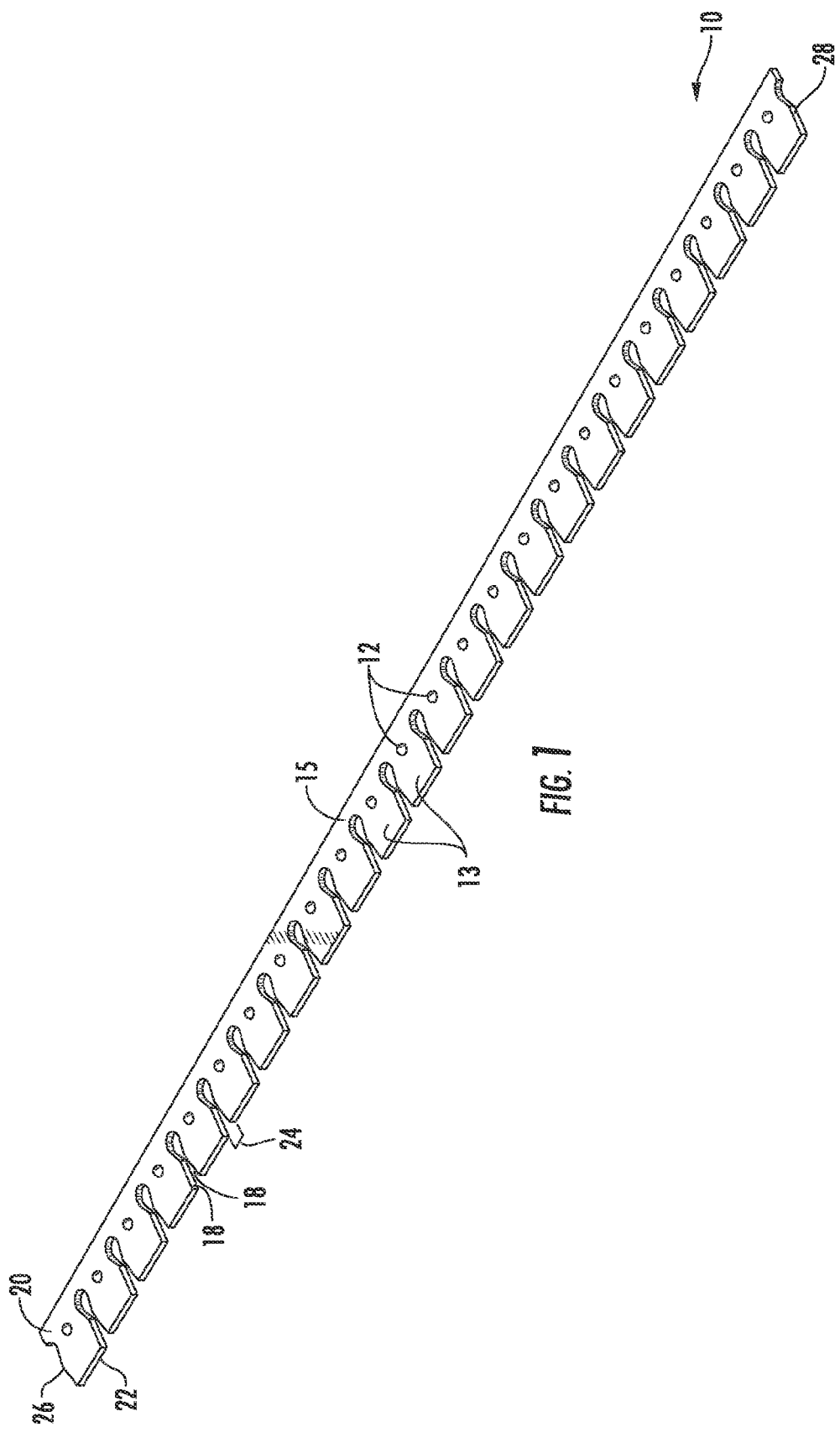
FIG. 1 is a top view of a printed circuit board according to one embodiment, shown in a generally straight configuration.

FIG. 1 illustrates a printed circuit board 10 according to one embodiment. In this particular embodiment, the board 10 is provided as an elongate, linear strip. However, the board 10 may be of any size and shape and is not limited to the linear board shown in FIG. 1. The board 10 can be provided in the desired size and shape by routing, milling, punching, die stamping, or using any suitable technique.

As shown in the embodiment of FIG. 1, the board 10 is made up of a plurality of repeating units 13. Board 10 has a top surface 20 and a bottom surface 22. An LED 12 is mounted on each repeating unit 13 and copper traces are printed on the top surface of the board to electrically interconnect the LEDs 12. Any number of LEDs 12 may be mounted on a repeating unit 13 or, alternatively, no LEDs may be provided on some of the repeating units 13. Board 10 may support any type of LED and the LEDs may be attached to board 10 in any suitable way, such as, but not limited to, using chip-on-board technology (i.e., direct die attachment), surface mounting, or through-hole attachment. Board 10 may be populated with LEDs 12 either before or after the board is deformed into its bent configuration, as discussed below.

Figure 2:
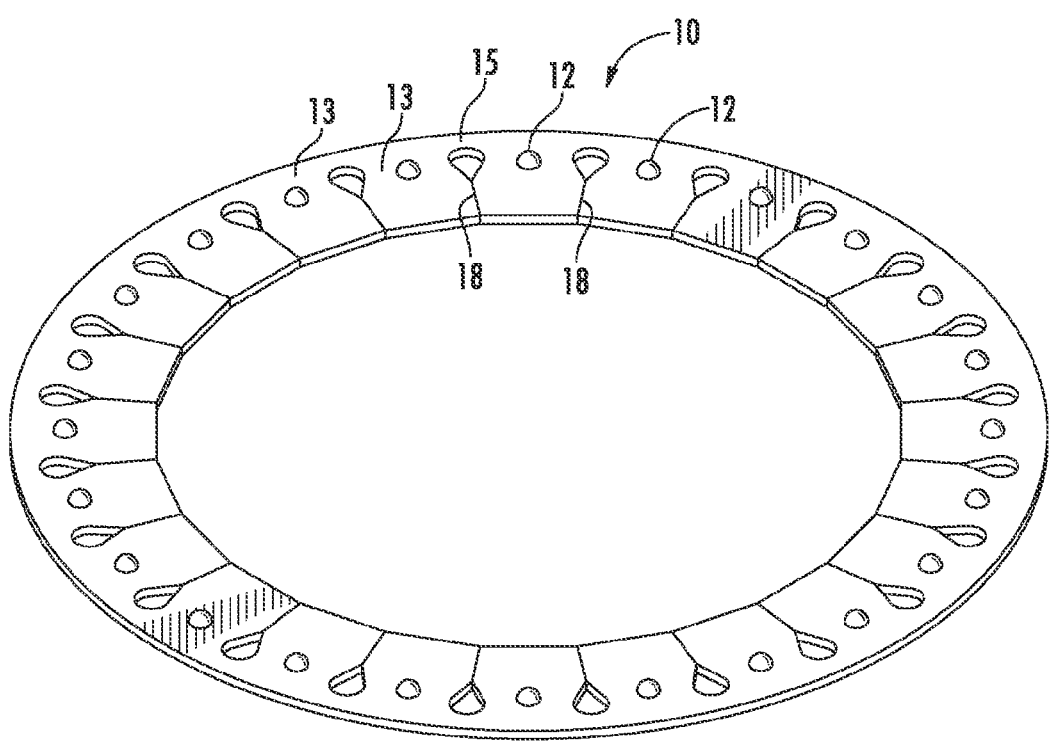
FIG. 2 is a top view of the board of FIG. 1, shown in a bent configuration.
Figure 3:
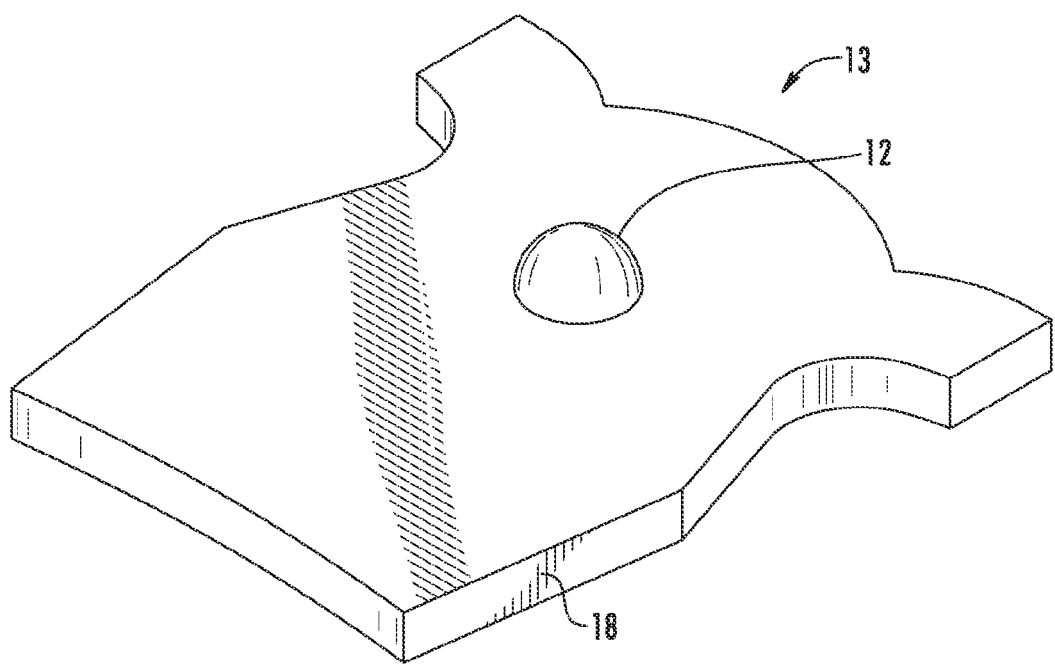
FIG. 3 is a top view of a repeating unit of a board according to another embodiment.
Figure 4:
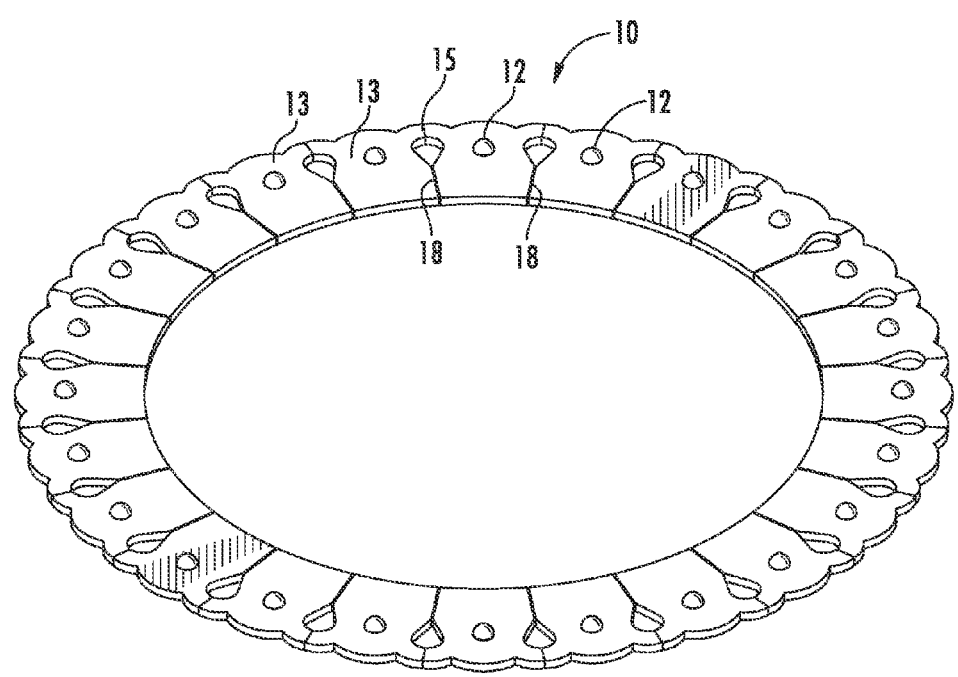
FIG. 4 is a top view of a board made up of the repeating unit of FIG. 3, the board shown in a bent configuration.

The repeating units 13 are designed and connected to permit in-plane deformation or bending of the board 10, as seen in FIG. 2. As shown in FIG. 1, adjacent units 13 are connected via a connector or bridge 15, although adjacent units may be connected in any suitable way.

Figure 5:
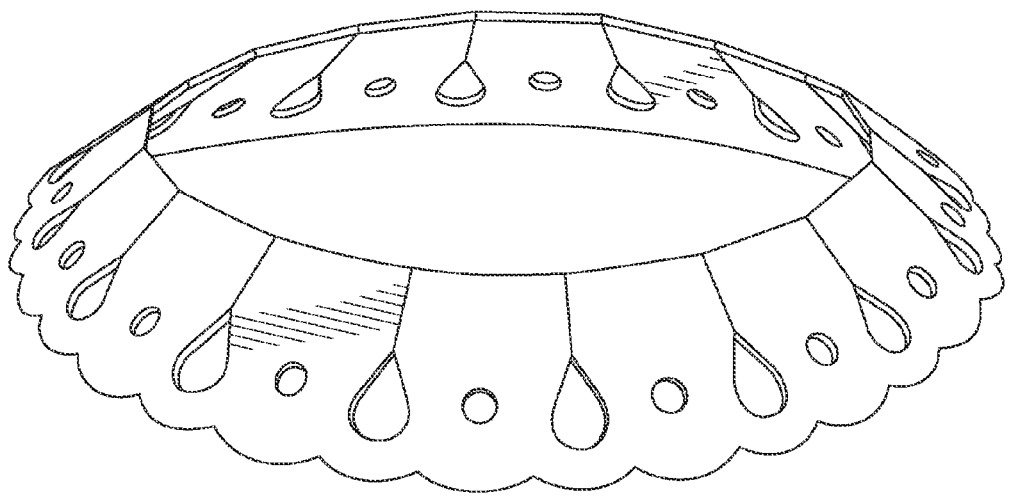
FIG. 5 is a perspective view of a printed circuit board according to another embodiment.

Board 10 is capable of being deformed into a generally bent configuration, as shown in FIG. 2. In some embodiments, as shown in FIG. 2, board 10 is bent into a generally ring-shaped configuration, although the blank may be bent into any suitable configuration such as an S-shaped configuration or a generally square configuration. In some embodiments, the bending of board 10 occurs in-plane, meaning that the plane in which the board 10 resides is the same before and after bending. For illustration purposes only, a board placed flat on a tabletop is bent in-plane when the board can be bent into the desired shape while remaining substantially flat on the table. In some embodiments, the bending of board 10 is not limited to in-plane bending. In these embodiments, board 10 may be bent in more than one plane, such as to form a three-dimensional shape as illustrated in the non-limiting embodiment of FIG. 5.

The repeating units 13 are designed and connected to permit such in-plane deformation or bending of the board 10. Bridges 15 connect adjacent repeating units 13 such that the adjacent edges 18 of adjacent repeating units 13 are separated by a space 24. In some embodiments, the adjacent edges 18 are straight, but other geometries are contemplated. Any number of repeating units 13 may be used and any number of bridges 15 connecting—and consequently any number of separating spaces 24 separating—the repeating units 13 may be provided. The number and shape of the repeating units 13, bridges 15, and spaces 24 may vary depending on the desired bent shape. By way only of example, the number of repeating units 13 (and consequently the number of spaces 24 between adjacent repeating units 13) needed to be able to bend a board 10 into a square may be less than that needed to bend a board 10 into a ring because much of the board 10 does not need to be able to bend when forming a square shape.

To shape the board into the desired shape (i.e., a ring in the embodiment of FIGS. 1 and 2), the board 10 is bent at and/or along bridges 15 such that adjacent repeating units 13 are brought closer to each other to narrow space 24. Cut-outs (such as notches) may be provided proximate the bridges 15 to more precisely control and predict the location of the bends.

In the embodiment of FIGS. 1 and 2, the board 10 is bent such that the space 24 between adjacent repeating units 13 is substantially eliminated such that the adjacent edges 18 of adjacent repeating units 13 contact each other and the ends 26, 28 of the board 10 meet. In this embodiment, the board 10 is self-aligning in that contact between the adjacent edges 18 of adjacent repeating units 13 limits the degree of bending and thus prevents over-bending of the board 10 beyond the desired shape. Note that in some embodiments some of the space 24 between adjacent repeating units 13 may exist after bending such that the adjacent edges 18 may not contact each other. Moreover, the ends 26, 28 of the board 10 may not meet in all embodiments.

Once bent into its desired shape, board 10 is configured to be self-retaining such that it retains the desired shape without the help of other support structure. This may be accomplished in a variety of ways. In some embodiments, the board 10 is a metal core printed circuit board, such that the metal of the board core is plastically (and permanently) deformed and retains the board shape after bending.

In other embodiments, the copper traces provided on the board (which can be metal core or otherwise) have a thickness that renders the traces strong enough to retain the entire board 10 in the desired shape after bending. In still other embodiments, mechanical retention features may be provided to retain the board. By way only of example, a tongue may be formed on one end 26 of the board 10 and a groove may be formed on the opposing end 28 of the board. Once the board 10 is bent, the tongue engages the groove to retain the board in the desired shape.

In some embodiments, a flexible dielectric and a flexible solder mask is provided on the board 10 facilitate bending.

In this embodiment, instead of providing a circle of LEDs on a rectangular board and removing the board material to create a ring-shaped board, a linear board may be formed directly into a ring-shaped board. This avoids the waste typically associated with customizing the shape of a PCB for a particular application. In some embodiments, a standard-sized PCB panel may be divided into multiple linear boards 10 nested in rows and temporarily connected together for handling during manufacturing and/or processing.

People of skill in the art will easily appreciate that other configurations than those illustrated in the Figures may be employed. Moreover, the boards 10 disclosed herein may be used in any application and are not limited to use in lighting fixtures.

The foregoing is provided for purposes of illustrating, explaining, and describing embodiments of the present invention. Further modifications and adaptations to these embodiments will be apparent to those skilled in the art and may be made without departing from the scope or spirit of the invention. Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the claims below.

We claim:

1. A printed circuit board comprising a blank and a plurality of LEDs mounted on the blank, wherein:
   a. the blank comprises a plurality of repeating units, wherein adjacent repeating units are connected to one another by a bridge and wherein the blank comprises a top surface and a bottom surface; and
   b. the plurality of LEDs are mounted on at least some of the repeating units,
   wherein the printed circuit board is bent along the bridges into a bent shape such that the bottom surface is oriented in a single plane and wherein the printed circuit board is configured to retain itself in the bent shape.

2. The printed circuit board of claim 1, wherein the blank comprises a metal core board.

3. The printed circuit board of claim 1, wherein at least some of the repeating units are identical.

4. The printed circuit board of claim 1, wherein the bent shape comprises a ring.

5. The printed circuit board of claim 1, wherein the bent shape is substantially a square.

6. The printed circuit board of claim 1, wherein the bent shape is generally S-shaped.

7. The printed circuit board of claim 1, wherein adjacent repeating units comprise adjacent edges separated by a space.

8. The printed circuit board of claim 7, wherein at least some of the adjacent edges are generally straight.

9. The printed circuit board of claim 7, wherein, when the printed circuit board is bent into the bent shape, at least some of the adjacent edges contact.

10. The printed circuit board of claim 1, wherein at least some of the bridges are curved.

11. The printed circuit board of claim 1, wherein at least one cut-out is provided in the blank at a location where a repeating unit connects to a bridge.

12. The printed circuit board of claim 1, further comprising a flexible dielectric.

13. The printed circuit board of claim 1, wherein the blank comprises a first end and a second end and wherein the first end and the second end meet when the printed circuit board is bent into the bent shape.

14. A metal core board for use in a printed circuit board, the metal core board comprising a plurality of repeating units, wherein adjacent repeating units are connected by a bridge, wherein the metal core board is configured to bend in-plane from a generally straight configuration into a bent shape and wherein the board is self-retaining so that the board retains itself in the bent shape.

15. The metal core board of claim 14, further comprising a plurality of LEDs mounted on the repeating units.

16. The metal core board of claim 14, wherein the bent shape comprises a ring.

17. The printed circuit board of claim 14, wherein the bent shape is substantially a square.

18. The printed circuit board of claim 14, wherein the bent shape is generally S-shaped.

19. The metal core board of claim 14, wherein the board is configured to bend along the bridges into the bent shape.

20. The metal core board of claim 14, wherein the repeating units are identical.

\* \* \* \* \*